United States Patent
McRobert et al.

(10) Patent No.: US 6,556,589 B2
(45) Date of Patent: Apr. 29, 2003

(54) NETWORK TRANSCEIVER FOR STEERING NETWORK DATA TO SELECTED PATHS BASED ON DETERMINED LINK SPEEDS

(75) Inventors: Stephen McRobert, Sunnyvale, CA (US); Ian S. Crayford, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/225,219

(22) Filed: Jan. 4, 1999

(65) Prior Publication Data

US 2002/0146043 A1 Oct. 10, 2002

Related U.S. Application Data

(60) Provisional application No. 60/082,183, filed on Apr. 17, 1998.

(51) Int. Cl.$^7$ .................................................. H04J 3/16
(52) U.S. Cl. ........................................ 370/501; 370/465
(58) Field of Search ................................. 370/401, 463, 370/445, 465, 402, 468, 501, 502, 535, 537, 274, 296, 293, 282, 279, 280, 278, 503; 375/211

(56) References Cited

U.S. PATENT DOCUMENTS

| | | | | |
|---|---|---|---|---|
| 5,400,332 A | * | 3/1995 | Imai | 370/501 |
| 5,566,160 A | * | 10/1996 | Lo | 370/246 |
| 5,617,418 A | | 4/1997 | Shirani et al. | 370/465 |
| 5,754,540 A | * | 5/1998 | Liu et al. | 370/315 |
| 5,991,303 A | * | 11/1999 | Mills | 370/402 |
| 6,055,241 A | * | 4/2000 | Raza et al. | 370/408 |
| 6,067,585 A | * | 5/2000 | Hoang | 370/401 |
| 6,141,350 A | * | 10/2000 | Mahale et al. | 370/462 |
| 6,256,312 B1 | * | 7/2001 | Joh | 370/401 |

FOREIGN PATENT DOCUMENTS

| | | | |
|---|---|---|---|
| EP | 31-751-a1 | * | 6/1991 |
| EP | 95-575 A1 | * | 7/1992 |
| EP | 0897231 A2 | | 2/1999 |
| WO | WO97/29573 | | 8/1997 |
| WO | WO98/30039 | | 7/1998 |

OTHER PUBLICATIONS

Somer, G., "Ethernet transceiver offers upgrade from existing networks," electronic Engineering, vol. 67, No. 820, Apr. 1, 1995, pp. 25, 26, 28 and 30.*
Goldberg, L. "100BASE–T4 Transceiver Simplifies Adapter, Repeater, and Switch Designs" Electronic Design, vol. 43, No. 6, Mar. 20, 1995, pp. 155, 156, 158, and 160.*
Bursky, D., "Chip set Delivers 100MBITS/S to the Desktop," Electronic design vol. 42, No 1 Jan. 10, 1994, pp. 45, 46, 48, 50, 55, and 56.*

(List continued on next page.)

Primary Examiner—Dang Ton

(57) ABSTRACT

A novel method of operating repeaters or other hub devices in a local area network, such as one conforming to Ethernet protocol, in which there are a plurality of repeater interfaces of respectively different data rates for communicating with a link partner on a network medium. The methodology comprises determining the data rate of operation of the link partner, and based on that data rate, automatically steering data between the network medium and a selected one of the repeaters. In a preferred embodiment, a network transceiver comprises one or more physical layer devices (PHY), and a plurality of shared data busses corresponding, respectively, to the speeds of operation of the repeaters, for interconnecting the repeaters and one or more of the physical layer devices. A multiplexer interconnects each of the one or more physical layer devices to a selected one of the plurality of busses, and an auto-negotiation unit controls the multiplexer to interconnect the physical layer devices to corresponding busses selected depending on the operating speed of the link partner.

13 Claims, 3 Drawing Sheets

OTHER PUBLICATIONS

Wright, M., "Network–Switch ICs Simplify Design and Slash Per–Port Costs," Electrical Design News, vol. 40, No. 24, Nov. 23, 1995, pp. 53–56, 58, and 60.*

Saunders, St., "Switch Mixes Unlike LANs at an Unlikely Low Price," Data Communications, vol. 23, No. 12, Sep. 1, 1994, pp. 49–50.*

Crayford, I., "10–Base–T in th eoffice," Wescon Technical Papers, vol. 35, Nov. 1, 1991, PP 232–237.,.*

Molle M., et al., "100Base–T/Ieee 802.12/Packet Switching," IEEE Communications Magazine, vol. 34, No. 8. Aug. 1996, pp. 64–73.*

"Fast Ethernet. Dawn of a New Network, Passage Text" Johnson, H.W., 1996, Upper Saddle River, Prentice Hall Ptr, US, pp. 41–52, 115–125, XP002072114, ISBN: 0–13–352643–7.

* cited by examiner under> # NETWORK TRANSCEIVER FOR STEERING NETWORK DATA TO SELECTED PATHS BASED ON DETERMINED LINK SPEEDS

RELATED APPLICATIONS

This application claims priority from provisional patent application Serial No. 60/082,183, filed on Apr. 17, 1998, (AMD ref. #C52397PRO).

TECHNICAL FIELD

The present invention relates to network interfacing, and more particularly to a novel network transceiver that steers network data streams to a selected data path compatible with the operating speed of a network link partner.

BACKGROUND ART

A Local Area Network, or (LAN), is a communications systems that provides a connection among a number of independent computing stations within a small area, such as a single building or group of adjacent buildings. One type of network structure uses one or more repeaters in a star topology, with each repeater having several ports. A data packet received at one port is retransmitted to all other ports of the repeater. Each repeater in turn restores timing and amplitude degradation of data packets received at one port and retransmits the packets to all other ports.

Traditional Ethernet networks (10BASE-T) operate at 10 Mb/s Ethernet protocol, as described by IEEE Standard 802.3; the majority of Ethernet interfaces currently operate at this data rate. However, a newer Ethernet standard, under IEEE standard 802.3 u, accomplishes the faster operation of 100 BASE-T systems, at a 100 Mb/s data rate (i.e., a 125 Mb/s encoded bit rate) using unshielded twisted pair (UTP) physical media. The 100 BASE-T standard defines operation over two pairs of category 5 UTP (100 BASE-TX) and over four pairs of category 3 UTP. The 100 BASE-FX network medium, covered by the 100 BASE-T standard, allows operation over dual fiber optic cabling.

Ethernet protocol provides for a Media Access Control (MAC), enabling network interface devices at each network node to share accesses to the network medium. One type of connection, termed a Media Independent Interface, or MII, connects the MAC to a physical layer (PHY) transceiver configured for a particular network medium, e.g., 10 BASE-T, 100 BASE-FX, or 100 BASE-TX. The physical layer transceiver is configured for converting the MII protocol signals output by the MAC into analog network signals, such as Multiple Layer Transition-3 (MLT-3) signals for 100 Mb/s Ethernet networks, or Manchester-encoded signals for 10 Mb/s Ethernet networks. (Networks often use several PHY devices operating over different media types.)

Ethernet switches have multiple interfaces, each capable of either 10 Mb/s or 100 Mb/s operation, and are able to be connected in communication with a link partner operating at a corresponding data rate. Because a switch allows multiple simultaneous traffic between its ports, it is possible to allow the ports to operate at a different speed relative to each other. A repeater, on the other hand, is configured to operate at only a single data rate. A 10 Mb/s repeater, for example, cannot be placed in communication with a link partner operating at 100 Mb/s. Moreover, the vast majority of Ethernet interfaces in today's networks operate only at 10 Mb/s, hence are unable to communicate with a repeater or switch that operates only at 100 Mb/s.

A 10/100 Mb/s switch is defined as one in which each switch port has a means of negotiating the speed of operation with a link partner connected to the port via a network medium. Auto-negotiation is performed by the switch as a link startup procedure each time a link to the switch port is connected, powered on or reset. During auto-negotiation, the switch automatically configures the link partner according to network configuration parameters; if the link partner cannot run at 100 Mb/s, the switch configures the link to run at 10 MB/s.

Repeaters are more economical than switches. But the limitation in operating speed versatility of a repeater makes it unsuitable in operating environments where it is necessary to adapt to the data rate of a link partner. It would be desirable to provide a repeater or repeater system having the variable data rate attributes of a switch. To achieve this objective, the invention implements automatic steering of a network data stream to a selected repeater interface having a data rate operating at the same data rate as the link speed of the network link partner.

DISCLOSURE OF INVENTION

The invention provides a novel method of operating repeaters or other hub devices in a local area network, such as one conforming to Ethernet protocol, in which there are a one or a plurality of repeaters having repeater interfaces operating at respectively different data rates for communicating with a link partner on a network medium. The methodology comprises determining the data rate link speed of the link partner, and based on that data rate, and automatically multiplexing data between the network medium and a selected one of the repeater interfaces.

In accord with one aspect of the invention, a network transceiver is configured for supplying network data, transported via a network medium between a link partner, to a selected repeater interface. The network transceiver includes an auto-negotiation unit for determining a link speed of the link partner via the network medium. The network transceiver also includes first and second data busses for providing data communication with first and second repeater interfaces at respective data rates, and a multiplexer circuit. The multiplexer circuit is configured for supplying the network data between the network medium and a selected one of the first and second data busses for data communication with the corresponding selected repeater interface at the corresponding data rate, based on the determined link speed of the link partner. Use of the multiplexer circuit and the first and second data busses enables the network data from one or a plurality of link partners to be automatically supplied (i.e., steered) to the appropriate repeater interface, based on the corresponding link speed of the link partner. The repeater interfaces may be implemented in separate repeaters operating at respective data rates, or in an integrated repeater having two separate data rate domains.

In accordance with another aspect of the invention, a repeater em comprises first and second repeater interfaces outputting network data at respective data rates, and a network transceiver. The network transceiver is configured for supplying the network data to at least one link partner via a corresponding network medium. The network transceiver includes a multiplexer circuit for supplying the network data between a selected one of the first and second repeater interfaces and the link partner according to a determined link speed of the link partner. Hence, the link partner is automatically connected to the appropriate repeater based on the determined link speed, enabling different speed network nodes to be connected by the network transceiver.

Still another aspect of the invention provides a method of supplying network data between repeater interfaces having respective data rates a network medium providing communication for a link partner. The method comprises determining a link speed of the link partner on the network medium, and connecting the link partner to a selected one of the repeater interfaces based on the determined link speed of the link partner. Hence, the link partner is automatically connected to a selected repeater interface, ensuring compatibility between network components having different data rate capabilities.

Various objects and features of the present invention will become more readily apparent of those skilled in the art from which the following description of a specific embodiment thereof, especially when taken in conjunction with the accompanying drawings.

BEST MODE FOR PRACTICING THE INVENTION

Figure 1:
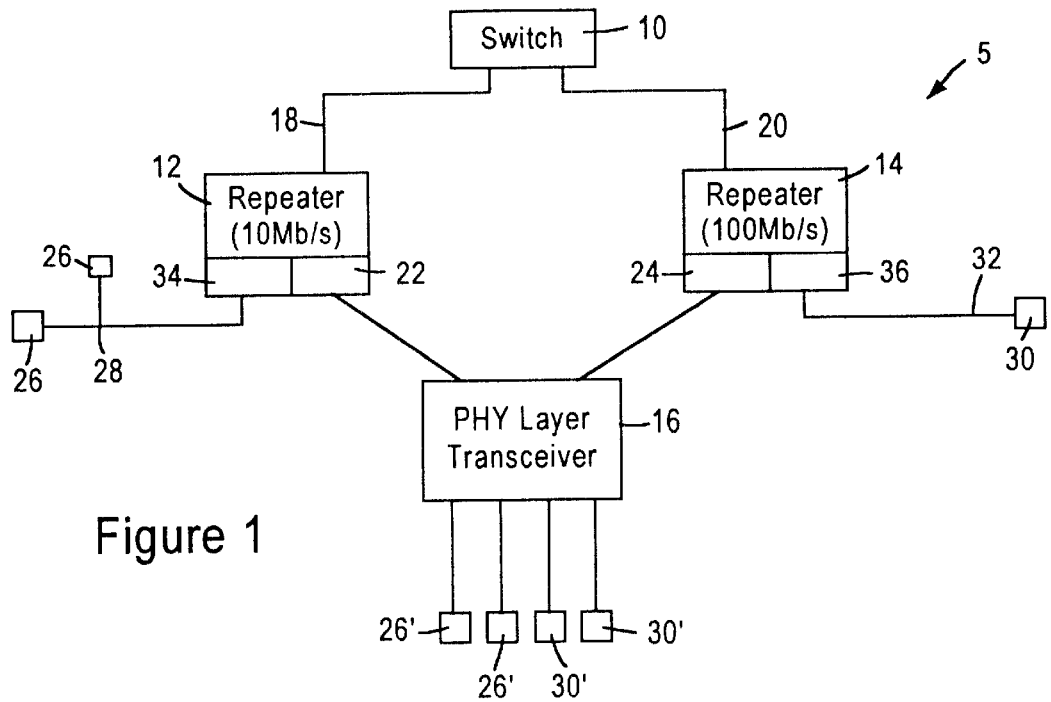
FIG. 1 is a diagram of a local area network architecture including a repeater system for transporting network data at different data rates according to an embodiment of the present invention.

FIG. 1 is a block diagram of an exemplary local area network architecture including a repeater system for transporting network data at different data rates according to an embodiment of the present invention. As shown in FIG. 1, the network 5 includes a network switch 10, a repeater 12 operating at a first data rate such as 10 Mb/s, a second repeater 14 operating at a second data rate such as 100 Mb/s, and a multiple port physical layer transceiver 16. The switch 10 and the repeater 12 transfer network data via a data link 18 operating at the first data rate of 10 Mb/s. The switch 10 and the repeater 14 transfer data via a different data link 20 operating at the second data rate of 100 Mb/s. The repeaters 12 and 14 transfer data to and from the network transceiver 16 via repeater interfaces 22 and 24 operating at 10 Mb/s and 100 Mb/s, respectively. As recognized in the art, the repeater 12 may also transfer network data to individual network workstations 26 operating at 10 Mb/s via a shared medium 28, and the repeater 14 may transfer data to network workstations 30 operating at 100 Mb/s via a network medium 32.

Hence, the network 5 includes a first data rate domain of 10 Mb/s and a second data rate domain of 100 Mb/s. Conventional systems would require separate physical layer (PHY) transceivers 34 and 36 that can operate only at a specific data rate. In this example, the PRY 34 would operate only at 10 Mb/s, and the PHY 36 would operate only at 100 Mb/s. Such an arrangement severely limits flexibility in design and enhancement of existing local area networks having slower data-rate workstations with newer workstations having faster data rates.

The multiple port physical layer transceiver 16 enables multiple workstations 26', 30' having different data rates of 10 Mb/s and 100 Mb/s, respectively, to be connected to a single PHY unit for communication with the repeater interfaces 22 and 24. Moreover, the physical layer transceiver 16 enables the network data from different workstations 26' and 30' to be automatically supplied (i.e., steered) to the appropriate data rate domain, enabling more flexible implementation of multiple-rate networks. A discussion of this steering of network data will be provided with reference to a single-port PHY transceiver in FIG. 2.

Figure 2:
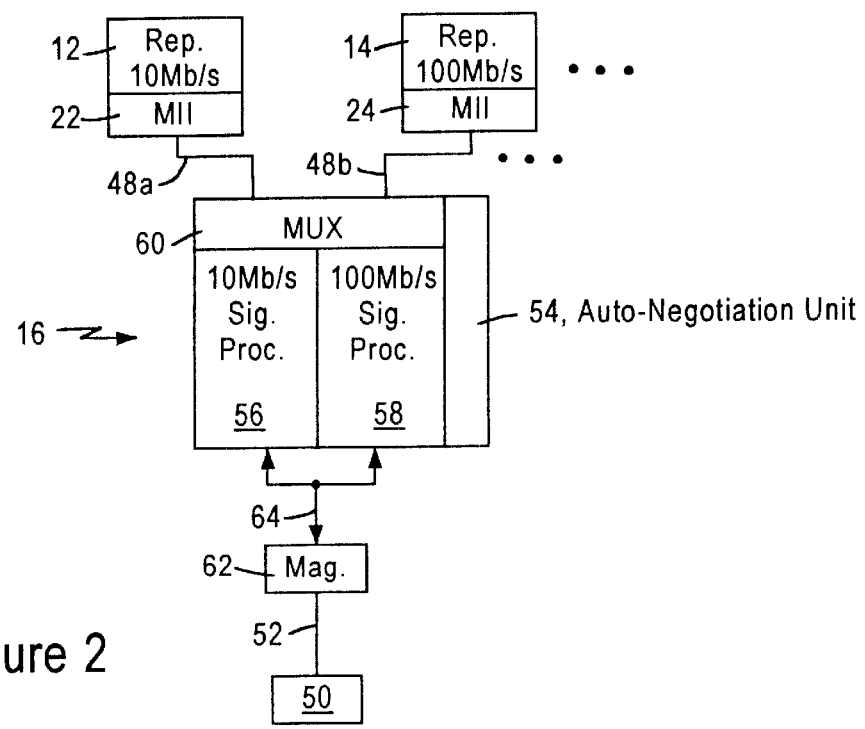
FIG. 2 is a simplified diagram of a single-port network transceiver according to an embodiment of the present invention.

FIG. 2 shows a single-port PHY transceiver, in accord with the invention, for establishing a communication path between a link partner 50 on a network medium 52 and one repeater interface from among a plurality of repeater interfaces that is data rate compatible with the operating speed (i.e., link speed) of the link partner 50. The repeater interfaces 22, 24 are implemented as Media Independent Interfaces (MIIs), and may correspond to separate repeaters, or an integrated multiple port repeater having different data rates. In addition, the repeaters 12 and 14, as well as the PHY 16, may be integrated on a single chip, or integrated on a hybrid circuit having multiple integrated circuits on a shared substrate.

The transceiver 16 of FIG. 2 (illustrated as a single-port PHY transceiver) comprises an auto-negotiation unit 54 that determines the speed of operation of link partner 50 on the network medium 52 using well-known auto-negotiation techniques. Additional details regarding auto-negotiation are disclosed in Breyer et al., "Switched and Fast Ethernet: How It Works and How to Use It", Ziff-Davis Press, Emeryville, Calif. (1995), pp. 60–70, and Johnson, "Fast Ethernet: Dawn of a New Network", Prentice-Hall, Inc. (1996), pp. 158–175.

The transceiver 16 also includes a first data rate path 56 for converting network data between MII format and 10 Mb/s Manchester-encoded signals for transmission and reception on a 10 Mb/s medium, and a second data rate path 58. The second data rate path 58 converts network data between MII format and a selected 100 Mb/s signal format, such as MLT-3 encoded signals.

The transceiver 16 also includes two or more data busses 48a and 48b connecting the PHY 16 to respective MIIs 22 and 24, and a multiplexer circuit. The multiplexer circuit 60 routes the output of the data paths 56 or 58 through a selected media independent interface 22, 24, etc., via the appropriate data bus 48, based on whichever one of the repeater interface 22, 24, etc. is data rate compatible with link partner 50. Hence, network data from the link partner 50 is transmitted via the medium 52 to an output interface 64 of the PHY transceiver 16 via a magnetic coupler 62. As known in the art, the magnetic coupler 62, coupled to the unshielded twisted pair (UTP) medium 52, provides AC coupling between the PHY interface 64 and the medium 52, plus electrical isolation. Depending on the determined data rate, the received analog network signals are supplied to the appropriate data path 56 or 58 to recover the network data in digital format from the received analog signals. The network data, recovered from the analog network signals, is then supplied by the appropriate data path 56 or 58 to the multiplexer circuit 60 for steering to the appropriate MII 22 or 24. Note that additional MIIs (not shown) may be coupled to the multiplexer circuit 60.

Figure 4:
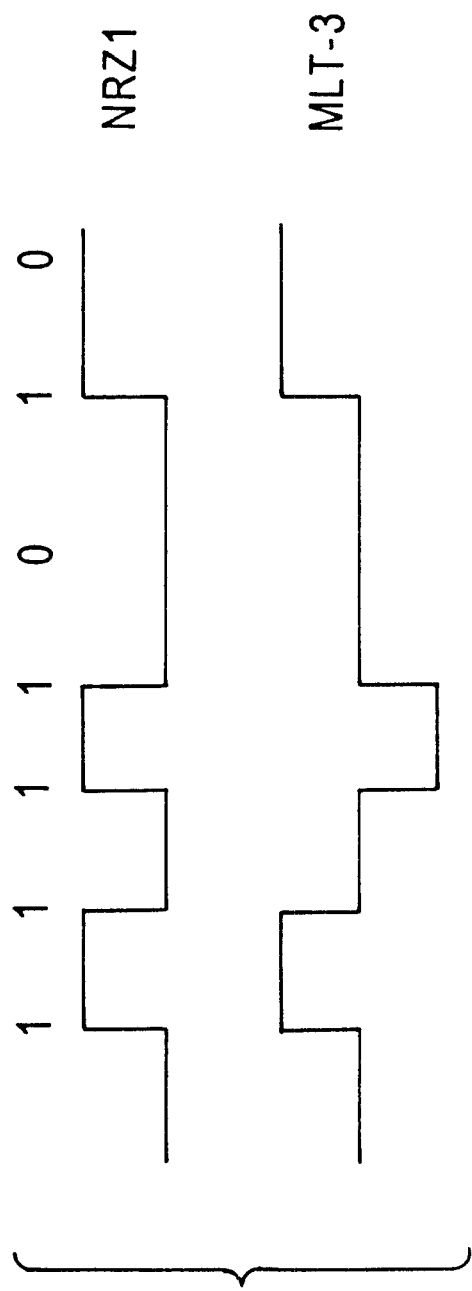
FIG. 4 shows NRZI and MLT-3 waveforms bearing a common bit sequence.

FIG. 4 illustrates the relationship between an NRZI-encoded digital signal and a corresponding three-level MLT-3 encoded analog signal in the 100 Mb/s data path 58. NRZI is a two-level signal, in which a transition indicates a logical one value and a lack of transition indicates a logical 0 value. MLT-3 is a tri-level signal, in which all transitions are between 0 and +1 volt or 0 and −1 volt, and where successive transitions are opposite in polarity, as shown in the FIG. 4. The purpose of MLT-3 encoding is to convert the NRZI bi-level digital signal into a tri-level signal more closely resembling a sinusoid having no DC component, and having energy of reduced intensity. The receive channel of the data path 58 recovers the digital data from the MLT-3 encoded signals received from the network medium 52, and passes to the appropriate MII (via the multiplexer circuit 60) a sequence of data nibbles or data bytes of network data from the link partner 50.

Figure 5:
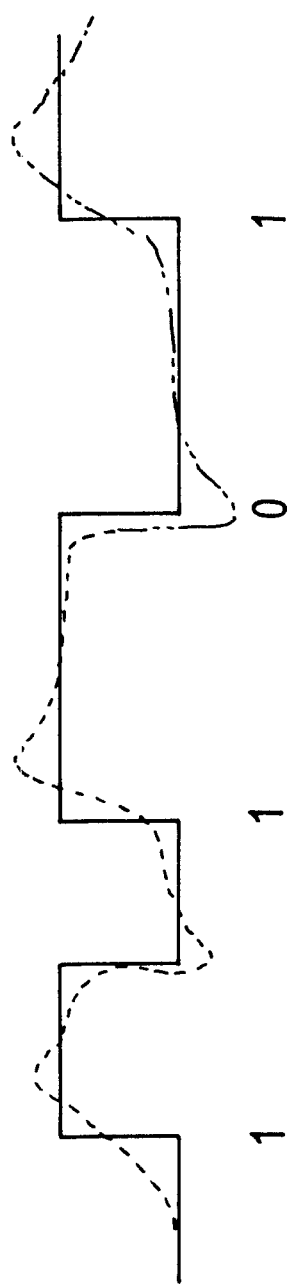
FIG. 5 shows processing of a Manchester encoded signal.

The 10 Mb/s channel receiver data path 56 requires no equalization or compensation of data incoming from the network because the rate of transmission is slower. The 10BASE-T receiver 56 identifies the amplitude of the incoming signal and determines whether the signal is of the correct width and amplitude. If the incoming signal from the network medium is determined to be a Manchester signal, shown in FIG. 5, the receiver 56 decodes it into NRZI signal protocol to be supplied to the appropriate MII. On the transmit side of the 10 Mb/s data path 56, pre-emphasis may be be added to the analog network signal transmitted to the link partner 50 compensate for signal decay on the network before a signal reaches its link partner. This pre-emphasis is in the form of a waveform bulge at the leading edge of each transition, as depicted by dotted lines in FIG. 5.

As described above, the auto-negotiation unit 54 determines the rate of data transmission at which the link partner 50 is capable of transmitting. If the link partner is capable of transmitting at 100 Mb/s, the auto-negotiation unit 36 controls the PHY device 16 to receive on the 100 Mb/s data path channel 58 and controls multiplexer circuit 60 to steer the output of the data path channel 58 to the data bus 48b for supply to the 100 Mb/s repeater interface 24. Similarly, network data output from the 100 Mb/s MII repeater interface 24 via the data bus 48b is supplied by the multiplexer circuit 60 to the data path 58 for transmission to the 100 Mb/s capable link partner 50.

If, however, the auto-negotiation unit 54 determines that the link partner 50 is capable of operating only at 10 Mb/s, the auto-negotiation unit 54 controls the PHY device to receive on the 10 Mb/s data path channel 56 and controls multiplexer circuit 60 to steer the output of the data path 56 to the data bus 48a for supply to the 10 Mb/s repeater interface 22. Similarly, network data output from the 10 Mb/s MII repeater interface 22 via the data bus 48a is supplied by the multiplexer circuit 60 to the data path 56 for transmission to the 10 Mb/s capable only link partner 50.

Hence, the arrangement of FIG. 2 enables a single link partner 50 to be connected to the appropriate MII repeater interface 22, 24, etc. based on the link speed of the link partner 50. An alternative arrangement enabling sharing of management resources, etc., in a multiple port PHY, is shown in FIG. 3.

Figure 3:
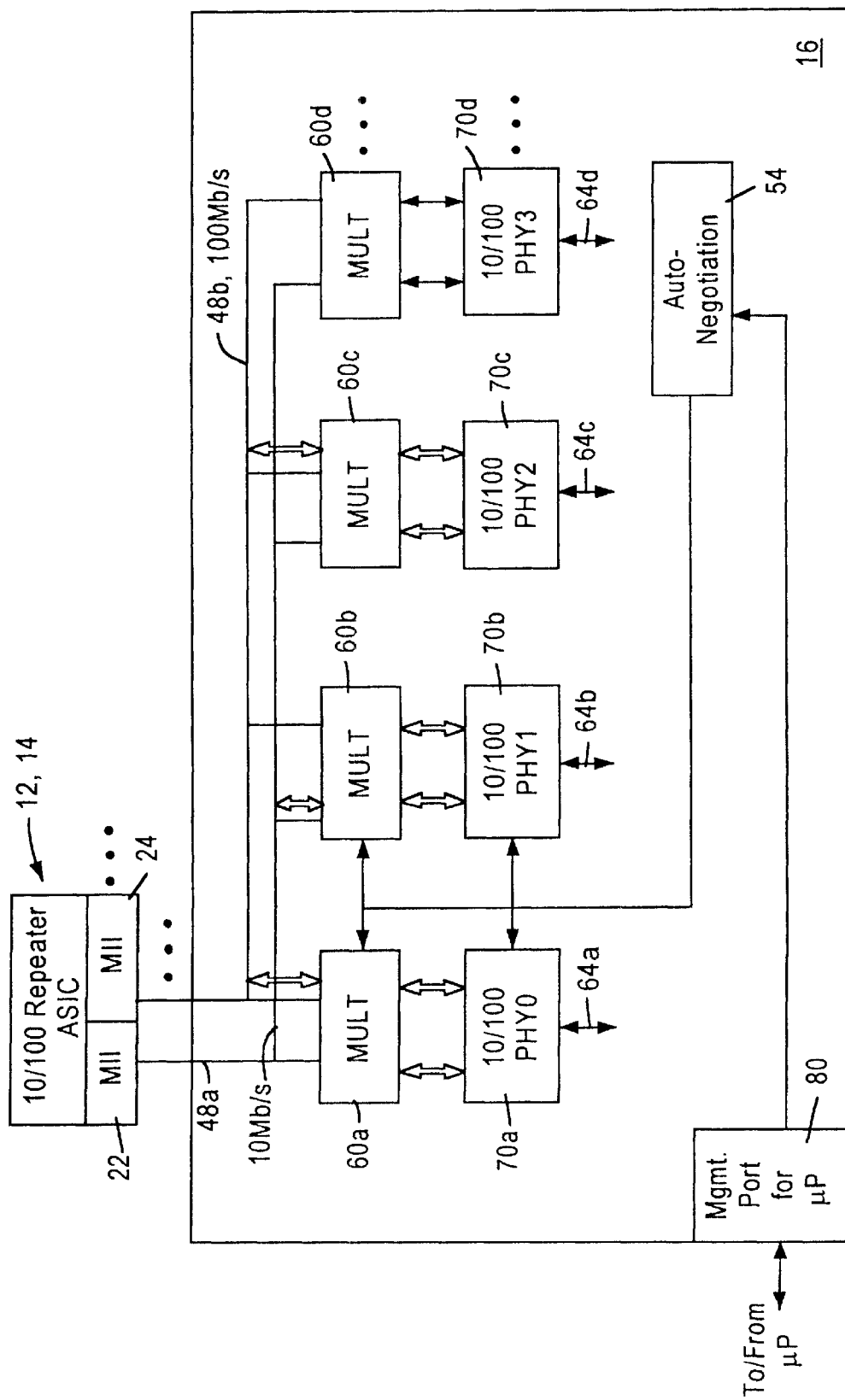
FIG. 3 is a diagram of a multiple-port network transceiver according to another embodiment of the present invention.

FIG. 3 shows another embodiment of the invention, in which the PHY transceiver 16 includes multiple PHY transceiver devices 70, each selectively connected, through corresponding multiplexers 60, to either the MII 22 or the MII 24 via the corresponding shared data busses 48a or 48b. Each PHY layer transceiver 70 includes a 10 Mb/s data path 56 and a 100 Mb/s data path 58. Hence, the shared data busses 48a and 48b may provide data communication with the shared MIIs 22 and 24 for multiple transceivers 70. Note that other signals may be shared on the busses 48, for example carrier sense (CRS), collision (COL), transmit clock, etc.

As shown in FIG. 3, the auto-negotiation unit 54 determines the link speed for each link partner for the corresponding PHY transceiver 70, and controls each corresponding multiplexer circuit 60 to connect to the appropriate data bus 48 based on the determined link speed of the link partner. The PHY layer device 16 also includes a management port 80, also referred to as a microprocessor port, that enables a management agent such as a microprocessor to access and control the auto-negotiation unit 54 and the multiplexers 60. Hence, an external microprocessor may send control commands to the multiplexer circuits 60 and the auto-negotiation unit 54 to cause the auto-negotiation unit 54 to release control of the circuits 60. The microprocessor may then send switch-type instructions to the multiplexers 60 for more advanced steering operations.

As shown in FIG. 3, the multiple-port arrangement 16 is integrated on a single chip 90, and is particularly economical in sharing the auto-negotiation unit 54 and other management fumctions across the multiple PHY transceivers 70.

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative way, rather than in a restrictive sense. For example, the invention is applicable in standards other than 10/100BASE-TX, for example 100BASE-FX in which fiber optic interfacing is added, and some signal processing varied, in ways known to persons skilled in the art. As another variation, although the described embodiment provides repeaters that are external to the PHY device, the repeaters could, alternatively, be configured within the PHY functionality. In addition, the invention encompasses repeater systems having additional busses 48 for multiple operating speeds, for example a repeater system for steering data between 10 Mb/s, 100 Mb/s, and Gigabit domains.

What is claimed is:

1. A network transceiver for supplying network data, transported via respective first and second network medium between first and second link partners to a selected repeater interface, the network transceiver comprising:

an auto-negotiation unit for determining respective link speeds of the first and second link partners via the respective network medium;

first and second shared data busses for providing data communication with first and second repeater interfaces at respective data rates; and a multiplexer circuit for supplying the network data between the first network medium and a first selected one of the first and second shared data busses for data communication with the corresponding selected repeater interface at the corresponding data rate, based on the determined link speed of the first link partner;

wherein at least one of the first and second repeater interfaces are shared media independent interfaces for transporting data received from the respective network medium; and a second multiplexer circuit for supplying network data between the second network medium and a second selected one of the first and second shared data busses for data communication with the selected repeater interface based on the determined link speed of the second link partner.

2. The transceiver according to claim 1, wherein first and second repeater interfaces are media independent interfaces conforming to IEEE Std. 802.3.

3. The transceiver according to claim 1, further comprising first and second physical layer transceivers for outputting network signals carrying network data from the selected repeater interface to the network medium and the second network medium, respectively.

4. The transceiver according to claim 3, wherein each physical layer transceiver includes first and second data rate paths, selected by the auto-negotiation unit based on the corresponding determined link speed.

5. The transceiver according to claim 4, wherein the first data rate path generates the corresponding network signals as MLT-3 encoded signals at 100 MB/s, and the second data rate path generates the corresponding network signals as Manchester-encoded signals at 10 MB/s.

6. The transceiver according to claim 5, wherein the network transceiver is integrated within a single silicon chip.

7. The transceiver according to claim 1, including a management port configured for supplying microprocessor control commands to the multiplexer circuit and the auto-negotiation unit, the auto-negotiation unit releasing control of the multiplexer circuit in response to elected microprocessor control commands.

8. The transceiver according to claim 1, including a microprocessor port coupled to said multiplexer for controlling operations of said multiplexer.

9. The transceiver according to claim 1, further comprising a plurality of physical layer devices recovering network data from a plurality of network media links at respective determined link speeds, the multiplexer circuit selectively steering the network data from the respective physical layer devices to the first and second data busses based on the respective determined link speeds.

10. The transceiver according to claim 9, including a management port configured for supplying microprocessor control commands to the multiplexer circuit and the auto-negotiation unit, the auto-negotiation unit releasing control of the multiplexer circuit in response to selected microprocessor control commands.

11. The transceiver according to claim 9, wherein the transceiver is integrated on a single chip.

12. A repeater system, comprising:

first and second repeater interfaces outputting network data at respective data rates; and a network transceiver for supplying the network data to at least one link partner via a corresponding network medium, the network transceiver comprising a multiplexer circuit for supplying the network data between a selected one of the first and second repeater interfaces and the at least one link partner according to a determined link speed of the link partner;

wherein the network transceiver further comprises first and second shared data busses for providing the network data to the multiplexer circuit from the first and second repeater interfaces at the respective operating speeds;

wherein the multiplexer circuit connects the first data bus to a first plurality of the link partners operating at a first determined link speed, and connects the second data bus to a second plurality of the link partners operating at a second determined link speed, and further comprising an auto-negotiation unit for determining the link speeds of the link partners, respectively.

13. The system according to claim 12, the network transceiver including a microprocessor port for controlling operations of said multiplexer.

* * * * *

UNITED STATES PATENT AND TRADEMARK OFFICE
CERTIFICATE OF CORRECTION

PATENT NO.    : 6,556,589 B2  Page 1 of 1
DATED         : April 29, 2003
INVENTOR(S)   : Stephen McRobert et al.

It is certified that error appears in the above-identified patent and that said Letters Patent is hereby corrected as shown below:

<u>Column 7,</u>
Line 19, change "elected" to -- selected --

Signed and Sealed this

Eighth Day of July, 2003

JAMES E. ROGAN
*Director of the United States Patent and Trademark Office*